United States Patent
Oh et al.

(10) Patent No.: US 9,709,716 B2
(45) Date of Patent: Jul. 18, 2017

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Minho Oh, Yongin (KR); Yongtack Kim, Yongin (KR); Jongwoo Kim, Yongin (KR); Jiyoung Moon, Yongin (KR); Yoonhyeung Cho, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 77 days.

(21) Appl. No.: 14/645,918

(22) Filed: Mar. 12, 2015

(65) Prior Publication Data

US 2016/0103257 A1    Apr. 14, 2016

(30) Foreign Application Priority Data

Oct. 13, 2014   (KR) .......................... 10-2014-0137851

(51) Int. Cl.
*G02B 5/20* (2006.01)
*G02F 1/1335* (2006.01)
*C23C 16/56* (2006.01)
*G02B 5/22* (2006.01)

(52) U.S. Cl.
CPC ............. *G02B 5/201* (2013.01); *C23C 16/56* (2013.01); *G02B 5/20* (2013.01); *G02B 5/223* (2013.01); *G02F 1/133509* (2013.01); *G02F 1/133512* (2013.01); *G02F 1/133514* (2013.01)

(58) Field of Classification Search
CPC ..... G02B 5/201; G02B 5/20; G02F 1/133514; G02F 1/133509; G02F 1/133512; C23C 16/56; B05D 3/06; B05D 3/08; B05D 3/00
USPC ..................... 359/885, 887, 890; 257/72, 59
See application file for complete search history.

(56) References Cited

U.S. PATENT DOCUMENTS

| | | | |
|---|---|---|---|
| 5,420,708 A * | 5/1995 | Yokoyama | G02F 1/1345 349/106 |
| 8,500,504 B2 * | 8/2013 | Ryuji | H01L 27/322 445/23 |
| 8,716,931 B2 * | 5/2014 | Lhee | H01L 27/3211 313/504 |
| 2003/0230972 A1 | 12/2003 | Cok | |
| 2004/0132855 A1 * | 7/2004 | Kohl | B81C 1/00103 522/150 |
| 2008/0143926 A1 * | 6/2008 | Amimori | G02B 5/3083 349/75 |

(Continued)

FOREIGN PATENT DOCUMENTS

KR    2003-0096029    12/2003
KR    10-2012-0053340    5/2012

(Continued)

*Primary Examiner* — William R Alexander
(74) *Attorney, Agent, or Firm* — Lee & Morse, P.C.

(57) ABSTRACT

A display apparatus includes a substrate, a display device on the substrate, the display device including a display area and a non-display area, an encapsulation member covering the display device, a surface treatment pattern layer on the encapsulation member, the surface treatment pattern layer selectively corresponding to one of the display area and the non-display area, and a photo-functional layer corresponding to a pattern of the surface treatment pattern layer.

18 Claims, 3 Drawing Sheets

(56) References Cited

U.S. PATENT DOCUMENTS

| | | | |
|---|---|---|---|
| 2008/0149934 A1* | 6/2008 | Daniel | H01L 51/0003 257/72 |
| 2008/0254560 A1* | 10/2008 | Yamazaki | H01L 27/1214 438/33 |
| 2009/0039349 A1* | 2/2009 | Honda | H01L 27/1214 257/59 |
| 2009/0209068 A1* | 8/2009 | Chang | H01L 27/1288 438/158 |
| 2009/0290102 A1* | 11/2009 | Amimori | G02F 1/133516 349/93 |
| 2009/0296248 A1* | 12/2009 | Gotoh | G02B 5/201 359/891 |
| 2010/0007270 A1 | 1/2010 | Suh | |
| 2010/0194672 A1* | 8/2010 | Kim | G02B 5/201 345/77 |
| 2010/0232162 A1 | 9/2010 | Shin et al. | |
| 2011/0215302 A1* | 9/2011 | Lhee | H01L 27/3211 257/40 |
| 2012/0119239 A1 | 5/2012 | Kim et al. | |
| 2014/0097414 A1 | 4/2014 | Kim et al. | |
| 2014/0376080 A1* | 12/2014 | Yokokawa | G02F 1/167 359/296 |
| 2014/0376081 A1* | 12/2014 | Yokokawa | G02F 1/167 359/296 |

FOREIGN PATENT DOCUMENTS

| | | |
|---|---|---|
| KR | 10-2012-0122534 A | 11/2012 |
| KR | 10-2014-0045157 | 4/2014 |

* cited by examiner

DISPLAY APPARATUS AND METHOD OF MANUFACTURING THE SAME

CROSS-REFERENCE TO RELATED APPLICATION

Korean Patent Application No. 10-2014-0137851, filed on Oct. 13, 2014, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the display apparatus.

2. Description of the Related Art

Recently, with a decrease in thickness and weight of display apparatuses, a usage range of the display apparatuses has extended. For example, general display apparatuses have been replaced with portable thin flat panel display apparatuses.

SUMMARY

Embodiments are directed to a display apparatus including a substrate, a display device on the substrate, the display device including a display area and a non-display area, an encapsulation member covering the display device, a surface treatment pattern layer on the encapsulation member, the surface treatment pattern layer selectively corresponding to one of the display area and the non-display area, and a photo-functional layer corresponding to a pattern of the surface treatment pattern layer.

The surface treatment pattern layer may include a hydrophilic material or a hydrophobic material.

The surface treatment pattern layer may include at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS).

The photo-functional layer may include a color filter that overlaps the display area or a black matrix that overlaps the non-display area.

The surface treatment pattern layer may correspond to the display area, and the photo-functional layer may include the color filter. The color filter may have a same hydrophobic or hydrophilic surface characteristic as the surface treatment pattern layer and may include an area overlapping the surface treatment pattern layer.

The surface treatment pattern layer may correspond to the display area, and the photo-functional layer may include the black matrix. The black matrix may have a different hydrophobic or hydrophilic surface characteristic from the surface treatment pattern layer and may be spaced apart from the surface treatment pattern layer or may be adjacent to the surface treatment pattern layer.

The surface treatment pattern layer may correspond to the non-display area, and the photo-functional layer may include the black matrix. The black matrix may have the same hydrophobic or hydrophilic surface characteristic as the surface treatment pattern layer and may include an area overlapping the surface treatment pattern layer.

The surface treatment pattern layer may correspond to the non-display area, and the photo-functional layer may include the color filter. The color filter may have a different hydrophobic or hydrophilic surface characteristic from the surface treatment pattern layer and may be spaced apart from the surface treatment pattern layer or may be adjacent to the surface treatment pattern layer.

The display apparatus may further include a protective layer that covers the photo-functional layer.

The display device may further include a first electrode, an intermediate layer comprising an emission layer, and a second electrode.

The encapsulation member may include at least one organic film or inorganic film.

An outermost layer of the encapsulation member may include the inorganic film. The surface treatment pattern layer may contact the inorganic film of the outermost layer of the encapsulation member.

Embodiments are also directed to a method of manufacturing a display apparatus. The method includes forming a display device including a display area and a non-display area on a substrate, forming an encapsulation member that covers the display device, forming a surface treatment pattern layer by selectively processing a surface treatment so as to correspond to the display area or the non-display area, and forming a photo-functional layer so as to correspond to a pattern of the surface treatment pattern layer.

Forming the surface treatment pattern layer may include controlling a surface energy to be selectively different in the display area and the non-display area.

Forming the surface treatment pattern layer may include performing a process of irradiating energy such that the surface treatment pattern layer selectively has hydrophilicity or hydrophobicity.

Forming the surface treatment pattern layer may be performed by using at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS).

Forming the surface treatment pattern layer may include adjusting an amount of a component in at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS) such that the surface treatment pattern layer selectively have hydrophilicity or hydrophobicity.

Forming the surface treatment pattern layer may be performed by using a same process as a process used in the forming of the encapsulation member.

Forming the encapsulation member may include forming the encapsulation member to include an inorganic film as an outermost layer of the encapsulation member. Forming the surface treatment pattern layer may be performed by using a same process as a process of forming the inorganic film as the outermost layer of the encapsulation member.

The inorganic film as the outermost layer of the encapsulation member may be formed by using a chemical vapor deposition (CVD) process. Forming the surface treatment pattern layer may be performed by using the CVD process.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, in one or more exemplary embodiments, while such terms as "first," "second," etc., may be used, but such components must not be limited to the above terms, and the above terms are used only to distinguish one component from another.

Hereinafter, in one or more exemplary embodiments, a singular form may include plural forms, unless there is a particular description contrary thereto.

Hereinafter, in one or more exemplary embodiments, terms such as "comprise" or "comprising" are used to specify existence of a recited feature or component, not excluding the existence of one or more other recited features or one or more other components.

Hereinafter, in one or more exemplary embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

Hereinafter, unless otherwise indicated, the term "corresponds to" refers to matching in location and/or dimension. For example, when one layer is said to correspond to another layer, the one layer may be located on or below the other layer, and the one layer and other layer may have the same areal coverage. For example, the one layer and the other layer may be in a complete overlapping relationship.

In one or more exemplary embodiments, an order of processes may be different from that is described. For example, two processes that are sequentially described may be substantially simultaneously performed, or may be performed in an opposite order to the described order.

Expressions such as "at least one of," when preceding a list of elements, modify the entire list of elements and do not modify the individual elements of the list.

Figure 1:
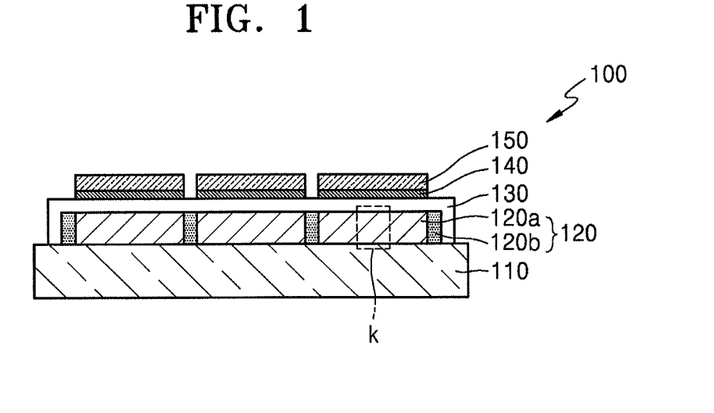
FIG. 1 illustrates a cross-sectional view of a display apparatus according to an exemplary embodiment.
Figure 2:
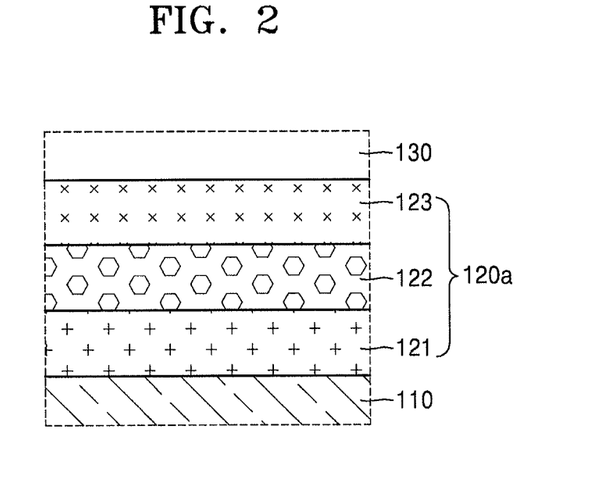
FIG. 2 illustrates a magnified view of a portion k of the display apparatus of FIG. 1.

FIG. 1 illustrates a cross-sectional view of a display apparatus 100 according to an exemplary embodiment. FIG. 2 illustrates a magnified view of a portion k of the display apparatus 100 of FIG. 1.

Referring to FIG. 1, the display apparatus 100 may include a substrate 110, a display device 120, an encapsulation member 130, a surface treatment pattern layer 140, and a photo-functional layer 150.

The substrate 110 may be formed of a glass material containing $SiO_2$ as a main component. In other implementations, the substrate 110 may be formed of a flexible material, e.g., a plastic material, which may be selected from various suitable organic materials.

In another implementation, the substrate 110 may be formed of a metal thin film.

A buffer layer may be formed between the substrate 110 and the display device 120. The buffer layer may prevent foreign substances from penetrating via the substrate 110, may provide a planar surface on the substrate 110, and may be formed of various suitable materials that perform that function. In some implementations, the buffer layer may be omitted.

The display device 120 may be formed on the substrate 110. The display device 120 may include a display area 120a and a non-display area 120b.

Referring to FIG. 1, a plurality of the display areas 120a and a plurality of the non-display areas 120b may be formed on the substrate 110. Three display areas 120a and four non-display areas 120b are illustrated in FIG. 1. However, the number of the display areas 120a and the number of the non-display areas 120b that are arranged in the display apparatus 100 may be a suitable number to display an image.

The non-display area 120b may be disposed adjacent to the display area 120a.

The display area 120a may provide a visible ray. The display area 120a may emit one or more visible rays so as to provide an image that is recognizable to a user of the display apparatus 100.

The non-display area 120b may be an area in which an image is not provided to the user of display apparatus 100.

The display area 120a and the non-display area 120b may be formed to be adjacent to each other. The non-display area 120b may be formed between two display areas 120a.

In an embodiment, a plurality of the display areas 120a may be arranged, and a plurality of the non-display areas 120b may be formed in spaces between the plurality of the display areas 120a.

In an implementation, the display area 120a may correspond to a sub-pixel or a pixel. The display areas 120a of the display apparatus 100 may be areas that correspond to a plurality of sub-pixels or pixels in the display apparatus 100.

A type of the display device 120 may vary. For example, the display device 120 may be an organic light-emitting device or a liquid crystal display device.

FIG. 2 illustrates a magnified view of a portion k of the display apparatus 100 of FIG. 1. FIG. 2 illustrates an organic light-emitting device as an example of the display device 120.

Referring to FIG. 2, the display device 120 may include a first electrode 121, a second electrode 123, and an intermediate layer 122. The intermediate layer 122 may include an emission layer so as to provide a visible ray. The display area 120a of the display device 120 may include the first electrode 121, the second electrode 123, and the intermediate layer 122.

Although FIG. 2 illustrates only the display area 120a of the display device 120, in another implementation, the first electrode 121, the second electrode 123, and the intermediate layer 122 may extend into the non-display area 120b.

The first electrode 121 may be formed of a suitable conductive material. In an embodiment, the first electrode 121 may include ITO, IZO, ZnO, or $In_2O_3$. According to an objective and a design condition, the first electrode 121 may further include a reflective layer formed of Ag, Mg, Al, Pt, Pd, Au, Ni, Nd, Ir, Cr, Li, Yb or Ca. The intermediate layer 122 may be formed on the first electrode 121. The intermediate layer 122 may include the emission layer so as to provide a visible ray. The emission layer may include an organic material that emits the visible ray. The emission layer of the intermediate layer 122 may include a host material and a dopant material.

In an implementation, the intermediate layer 122 may include at least one selected from a hole injection layer (HIL), a hole transport layer (HTL), an electron transport layer (ETL), and an electron injection layer (EIL), as well as the emission layer.

The second electrode 123 may be formed on the intermediate layer 122. In an implementation, the second electrode 123 may be formed of a metal material including Ag, Mg, Al, Pt, Pd, Au, Ni, Nd, Ir, Cr, Li, or Ca. For example, the second electrode 123 may be formed as a composite layer of an Mg-layer and an Ag-layer.

The encapsulation member 130 may be formed on the display device 120.

In an embodiment, the encapsulation member 130 may be in the form of a film that is formed of a flexible material and may have a thickness between about 1 µm and about 10 µm.

The encapsulation member 130 may include an organic film or an inorganic film. For example, the encapsulation member 130 may be a stack of at least one organic film and at least one inorganic film.

In an implementation, the inorganic film may be disposed at the outermost layer of the stack of the encapsulation member 130.

The encapsulation member 130 may be formed to correspond to a side surface of the display device 120, and may be formed to cover the display device 120.

The surface treatment pattern layer 140 may be formed on the encapsulation member 130 to correspond to the display area 120a. The surface treatment pattern layer 140 may have hydrophilicity or hydrophobicity.

A suitable method may be used to cause the surface treatment pattern layer 140 to have hydrophilicity or hydrophobicity. For example, surface energy of the surface treatment pattern layer 140 may be controlled. When the surface treatment pattern layer 140 is formed, a process of irradiating energy, such as by a laser or an ultra violet (UV) ray, may be performed to convert the surface energy, such that a surface of the surface treatment pattern layer 140 may have hydrophobicity or hydrophilicity.

In an embodiment, the surface treatment pattern layer 140 may include at least one selected from the group of tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS).

For example, the surface treatment pattern layer 140 may include HMDSO. In this case, the surface treatment pattern layer 140 may be provided with hydrophilicity by increasing an amount of included oxygen or may be provided with hydrophobicity by decreasing the amount of the included oxygen. Similarly, by adjusting an amount of oxygen in others of the above materials that may be included in the surface treatment pattern layer 140, the surface treatment pattern layer 140 may be provided with hydrophilicity or hydrophobicity.

The surface treatment pattern layer 140 may be formed by using various methods in various environments. In embodiments where the surface treatment pattern layer 140 does not have a barrier characteristic, the surface treatment pattern layer 140 may be formed in a vacuum or an air atmosphere.

In another implementation, the surface treatment pattern layer 140 may be formed by using same the process as a process used in forming the encapsulation member 130. If the encapsulation member 130 has a plurality of layers, the surface treatment pattern layer 140 may be formed by using the same process as a process used in forming one of the plurality of layers of the encapsulation member 130.

In another implementation, if the outermost layer of the encapsulation member 130 includes the inorganic film, the surface treatment pattern layer 140 may be easily formed by using a same process as a process of forming the inorganic film. For example, the process may be a chemical vapor deposition (CVD) process.

As described above, the surface treatment pattern layer 140 may include at least one selected from the group consisting of TMS, TEOS, HMDSO, TMDSO, HMDSN, TOMCTS, and OMCTS, and the aforementioned materials may be easily formed by using the CVD process.

The photo-functional layer 150 may control a characteristic of light that is emitted from the display device 120. For example, the photo-functional layer 150 may be a photo-conversion member or a color filter that converts a color of light that is emitted from the display area 120a. The photo-functional layer 150 may improve a luminescent quality of the display apparatus 100 by changing or enhancing a characteristic of light that is emitted from the display area 120a.

The photo-functional layer 150 may be formed to correspond to a pattern of the surface treatment pattern layer 140.

In an implementation, the photo-functional layer 150 may include a material having a same or similar color as light emitted from the display area 120a.

For example, the photo-functional layer 150 may include blue, green, or red photo-functional layers 150.

The photo-functional layer 150 may have hydrophilicity or hydrophobicity that is a same surface characteristic as that of the surface treatment pattern layer 140. For example, if the surface treatment pattern layer 140 has hydrophilicity, the photo-functional layer 150 may also have hydrophilicity, and if the surface treatment pattern layer 140 has hydrophobicity, the photo-functional layer 150 may also have hydrophobicity.

When hydrophilicity or hydrophobicity of the photo-functional layer 150 and the surface treatment pattern layer 140 are matched, the photo-functional layer 150 may have a pattern that corresponds to the surface treatment pattern layer 140, without performing a separate patterning process such as a photo-lithography process. For example, the photo-functional layer 150 may be formed on the surface treatment pattern layer 140 while the photo-functional layer 150 overlaps with the surface treatment pattern layer 140. In this embodiment, description that the photo-functional layer 150 "corresponds to" the surface treatment pattern layer 140 includes a meaning that the photo-functional layer 150 overlaps with the surface treatment pattern layer 140 in the display area 120*a*.

After the surface treatment pattern layer 140 is formed, if a liquid material for forming the photo-functional layer 150 is coated onto the surface treatment pattern layer 140 without using a separate mask, the liquid material for forming the photo-functional layer 150 may be naturally disposed while corresponding only to the surface treatment pattern layer 140. As a result, the photo-functional layer 150 that has the pattern corresponding to the surface treatment pattern layer 140 may be formed.

Accordingly, the photo-functional layer 150 that corresponds to the display area 120*a* may be formed.

In an implementation, the photo-functional layer 150 may be formed by using a slit die coating process, a spin coating process, or an inkjet process. If the surface treatment pattern layer 140 has hydrophilicity, in order to make hydrophilicity of the photo-functional layer 150 correspond to that of the surface treatment pattern layer 140, the photo-functional layer 150 may be formed by using a solvent including a sulfone group (—$SO_3H$), a carboxyl group (—COOH), an amino group (—$NH_2$), an ammonia group (—$NH_4$), —$SO_3$ or —COOM (where M is alkali metal) that is a hydrophilic functional group.

In an embodiment, if the surface treatment pattern layer 140 has hydrophobicity, in order to have hydrophobicity corresponding to that of the surface treatment pattern layer 140, the photo-functional layer 150 may be formed by using a solvent including fluorine, hydrocarbon, alkyl halide, an organosilicic compound, alkyl, or benzyl that is a hydrophobic functional group.

In the present embodiment, the display apparatus 100 may include the photo-functional layer 150 that corresponds to the display area 120*a*. The photo-functional layer 150 may be a photoconversion member or a color filter. Transmittance of a color, or the like of that is first generated in the display area 120*a* may be controlled such that a luminescent quality of the display apparatus 100 may be improved. In particular, if the light is appropriately controlled, a polarization member may be omitted.

Also, in the present embodiment, the display apparatus 100 may include the surface treatment pattern layer 140 that is formed on the encapsulation member 130 and has hydrophobicity or hydrophilicity. The photo-functional layer 150 that has the same surface characteristic (i.e., hydrophobicity or hydrophilicity) as the surface treatment pattern layer 140 may be arranged on the surface treatment pattern layer 140. Accordingly, the photo-functional layer 150 that has a pattern corresponding to the surface treatment pattern layer 140 may be easily formed without performing a complicated patterning process or a complicated photo-lithography process including a wet process.

In an implementation, the outermost layer of the encapsulation member 130, e.g., the inorganic film, may be formed, and then, a simple process, e.g., a process of converting surface energy of the inorganic film, may be performed, such that the surface treatment pattern layer 140 may be formed. By forming the surface treatment pattern layer 140 in this manner, a method of manufacturing the display apparatus 100 may be have improved efficiency in a manufacturing process.

Figure 3:
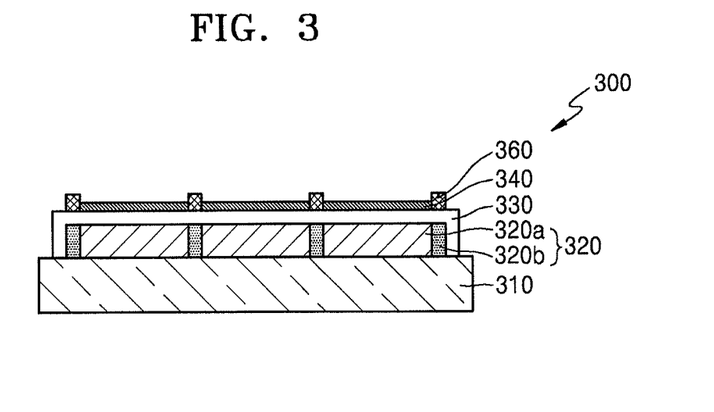
FIG. 3 illustrates a cross-sectional view of a display apparatus, according to another exemplary embodiment.

FIG. 3 illustrates a cross-sectional view of a display apparatus 300, according to another exemplary embodiment. For convenience of description, the present embodiment is described with reference to differences from the previous embodiment. Referring to FIG. 3, the display apparatus 300 may include a substrate 310, a display device 320, an encapsulation member 330, a surface treatment pattern layer 340, and a photo-functional layer 350.

The surface treatment pattern layer 340 and the photo-functional layer 360 may be formed on the encapsulation member 330.

The surface treatment pattern layer 340 may be formed on the encapsulation member 330 and may correspond to a display area 320*a* of the display device 320.

The surface treatment pattern layer 340 may be formed to have hydrophilicity or hydrophobicity. A material and method of forming the surface treatment pattern layer 340 may be the same as those described with reference to the previous embodiment, thus, detailed descriptions thereof are not repeated here.

The photo-functional layer 360 may be formed on the encapsulation member 330 so as to correspond to the non-display area 320*b*. The photo-functional layer 360 may be capable of controlling a characteristic of light that is emitted from the display device 320. For example, the photo-functional layer 360 may include a member, e.g., a black matrix that blocks light so as to prevent light that is generated in the display area 320*a* from being extracted via the non-display area 320*b*. By forming the photo-functional layer 360 to correspond to the non-display area 320*a*, a contrast of the display apparatus 300 is enhanced, so that a luminescent quality of the display apparatus 300 is improved.

In an implementation, the photo-functional layer 360 may be spaced apart from the surface treatment pattern layer 340. In another implementation, the photo-functional layer 360 may be formed to contact a side surface of the surface treatment pattern layer 340.

The photo-functional layer 360 may have a different surface characteristic, i.e., hydrophilicity or hydrophobicity, from that of the surface treatment pattern layer 340. For example, if the surface treatment pattern layer 340 has hydrophilicity, the photo-functional layer 360 may have hydrophobicity, and if the surface treatment pattern layer 340 has hydrophobicity, the photo-functional layer 360 may have hydrophilicity.

By providing the photo-functional layer 360 with a different surface characteristic, i.e., hydrophilicity or hydrophobicity, from that of the surface treatment pattern layer 340, the photo-functional layer 360 may be formed to have a pattern that does not overlap the surface treatment pattern layer 340, without performing a separate patterning process such as a photo-lithography process. For example, the photo-functional layer 360 may be formed to be adjacent to the side surface of the surface treatment pattern layer 340 or may be formed in a space between the surface treatment pattern layers 340.

In the present embodiment, the description that the photo-functional layer 360 "corresponds to" the surface treatment pattern layer 340 includes a meaning that the photo-functional layer 360 is formed to be spaced apart from or to contact the side surface of the surface treatment pattern layer 340 along a pattern of the surface treatment pattern layer 340.

The photo-functional layer 360 may be formed by using a slit die coating process, a spin coating process, or an inkjet process, and if the surface treatment pattern layer 340 has hydrophilicity, in order to have hydrophobicity that is different from the hydrophilicity of the surface treatment pattern layer 340, the photo-functional layer 360 may be formed by using a solvent including fluorine, hydrocarbon, alkyl halide, an organosilicic compound, alkyl, or benzyl that is a hydrophobic functional group.

If the surface treatment pattern layer 340 has hydrophobicity, in order to make hydrophilicity of the photo-functional layer 360 be different from the hydrophobicity of the surface treatment pattern layer 340, the photo-functional layer 360 may be formed by using a solvent including a sulfone group ($-SO_3H$), a carboxyl group ($-COOH$), an amino group ($-NH_2$), an ammonia group ($-NH_4$), $-SO_3$ or $-COOM$ (where M is alkali metal) that is a hydrophilic functional group.

The display apparatus 300 may include the photo-functional layer 360 that corresponds to the non-display area 320b. For example, the photo-functional layer 360 may include a black matrix for blocking light. By forming the black matrix, emission of light via the non-display area 320b may be decreased or prevented, such that a contrast of the display apparatus 300 may be improved.

Also, the display apparatus 300 includes the surface treatment pattern layer 340 that is formed on the encapsulation member 330 and has hydrophobicity or hydrophilicity. The photo-functional layer 360 having a surface characteristic (i.e., hydrophobicity or hydrophilicity) different from that of the surface treatment pattern layer 340 may be arranged on the surface treatment pattern layer 340. Accordingly, the photo-functional layer 360 that has a pattern corresponding to the surface treatment pattern layer 340, i.e., the photo-functional layer 360 that contacts a side surface of the surface treatment pattern layer 340 so as to be adjacent to the surface treatment pattern layer 340 or is separate from the surface treatment pattern layer 340, may be easily formed without performing a complicated patterning process or a complicated photo-lithography process including a wet process.

In particular, an outermost layer of the encapsulation member 330, e.g., an inorganic film, may be formed and then a process of converting surface energy of the inorganic film may be performed, such that the surface treatment pattern layer 340 may be easily formed. By forming the surface treatment pattern layer 340 in this manner, a method of manufacturing the display apparatus 300 may have improved efficiency in a manufacturing process.

Figure 4:
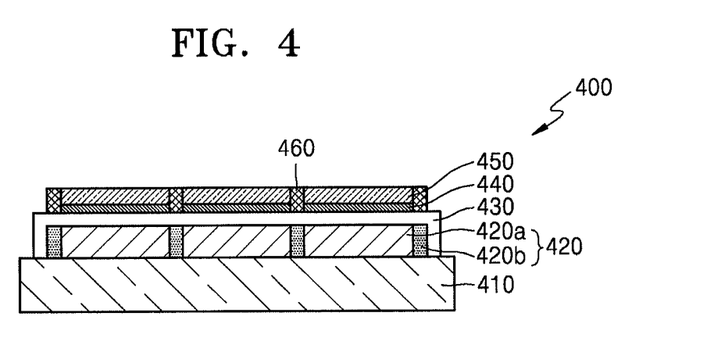
FIG. 4 illustrates a cross-sectional view of a display apparatus, according to another exemplary embodiment.

FIG. 4 is a cross-sectional view of a display apparatus 400, according to another exemplary embodiment. For convenience of description, the present embodiment is described with reference to differences from the previous embodiment. Referring to FIG. 4, the display apparatus 400 may include a substrate 410, a display device 420, an encapsulation member 430, a surface treatment pattern layer 440, a first photo-functional layer 450, and a second photo-functional layer 460.

The surface treatment pattern layer 440, the first photo-functional layer 450 and the second photo-functional layer 460 may be formed on the encapsulation member 430.

The surface treatment pattern layer 440 may be formed to correspond to a display area 420a of the display device 420.

The surface treatment pattern layer 440 may be formed to have hydrophilicity or hydrophobicity. A material and method of forming the surface treatment pattern layer 440 may be the same as those described with reference to the previous embodiment, thus, detailed descriptions thereof are omitted here.

The first photo-functional layer 450 may control a characteristic of light that is emitted from the display device 420. For example, the first photo-functional layer 450 may be a photo conversion member or a color filter that converts a color of light that is emitted from the display area 420a. The first photo-functional layer 450 may improve a luminescent quality of the display apparatus 400 by changing or enhancing a characteristic of light that is emitted from the display area 420a.

The first photo-functional layer 450 may have hydrophilicity or hydrophobicity that is a same surface characteristic as that of the surface treatment pattern layer 440. For example, if the surface treatment pattern layer 440 has hydrophilicity, the first photo-functional layer 450 may also have hydrophilicity. If the surface treatment pattern layer 440 has hydrophobicity, the first photo-functional layer 150 may also have hydrophobicity.

The first photo-functional layer 450 may be formed on the surface treatment pattern layer 440 while the first photo-functional layer 450 overlaps with the surface treatment pattern layer 440. In the present embodiment, the description that the first photo-functional layer 450 "corresponds to" the surface treatment pattern layer 440 includes a meaning that the first photo-functional layer 450 overlaps with the surface treatment pattern layer 440 in the display area 420a.

The second photo-functional layer 460 may be formed on the encapsulation member 430 so as to correspond to the non-display area 420b. The second photo-functional layer 460 may be capable of controlling a characteristic of light that is emitted from the display device 420. For example, the second photo-functional layer 460 may include a member such as a black matrix that blocks light so as to prevent light that is generated in the display area 420a from being extracted via the non-display area 420b. By forming the second photo-functional layer 460 as a black matrix, a contrast of the display apparatus 400 may be enhanced, such that a luminescent quality of the display apparatus 400 may be improved.

In an implementation, the second photo-functional layer 460 may be spaced apart from the surface treatment pattern layer 440, or in another embodiment, the second photo-functional layer 460 may be formed to contact a side surface of the surface treatment pattern layer 440.

The second photo-functional layer 460 may have a different surface characteristic, i.e., hydrophilicity or hydrophobicity, from that of the surface treatment pattern layer 440. For example, if the surface treatment pattern layer 440 has hydrophilicity, the second photo-functional layer 460 may have hydrophobicity, and if the surface treatment pattern layer 440 has hydrophobicity, the second photo-functional layer 460 may have hydrophilicity.

In an implementation, a side surface of the first photo-functional layer 450 may contact the second photo-functional layer 460.

In another implementation, a side surface of the second photo-functional layer 460 may contact the first photo-functional layer 450.

In another implementation, a side surface of the first photo-functional layer 450 may contact a side surface of the second photo-functional layer 460.

In the present embodiment, the display apparatus 400 may include the first photo-functional layer 450 that corresponds to the display area 420a. The first photo-functional layer 450 may be a photoconversion member or a color filter. Qualities such as transmittance, a color, or the like, of light that is first generated in the display area 420a may be controlled so improve a luminescent quality of the display apparatus 400. For example, if light is appropriately controlled, a polarization member may be omitted.

The display apparatus 400 may include the second photo-functional layer 460 that corresponds to the non-display area 420b including a black matrix for blocking light. By so including the second photo-functional layer 460, emission of the light via the non-display area 420b may be decreased or prevented, such that a contrast of the display apparatus 400 may be improved.

In the present embodiment, the display apparatus 400 may include the surface treatment pattern layer 440 that is formed on the encapsulation member 430. The surface treatment pattern layer 440 may have hydrophobicity or hydrophilicity. Also, the first photo-functional layer 450 having the same surface characteristic (i.e., hydrophobicity or hydrophilicity) as that of the surface treatment pattern layer 440 may be formed on the surface treatment pattern layer 440, and the second photo-functional layer 460 having the different surface characteristic (i.e., hydrophobicity or hydrophilicity) from that of the surface treatment pattern layer 440 may be formed on the surface treatment pattern layer 440, such that the first photo-functional layer 450 and the second photo-functional layer 460, which have patterns corresponding to the surface treatment pattern layer 440, may be easily formed without performing a complicated patterning process or a complicated photo-lithography process including a wet process.

In an implementation, an outermost layer of the encapsulation member 430, e.g., an inorganic film, may be formed and then a simple process, e.g., a process of converting surface energy of the inorganic film, may be performed, such that the surface treatment pattern layer 440 may be formed. By forming the surface treatment pattern layer 440 in this manner, a method of manufacturing the display apparatus 400 may have improved efficiency in a manufacturing process.

Figure 5:
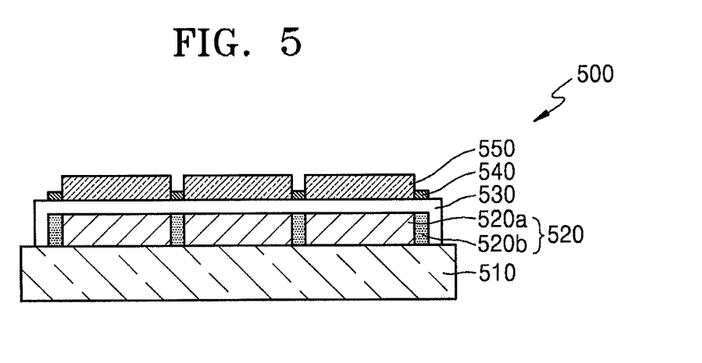
FIG. 5 illustrates a cross-sectional view of a display apparatus, according to another exemplary embodiment.

FIG. 5 illustrates a cross-sectional view of a display apparatus 500, according to another exemplary embodiment.

Referring to FIG. 5, the display apparatus 500 may include a substrate 510, a display device 520, an encapsulation member 530, a surface treatment pattern layer 540, and a photo-functional layer 550. For convenience of description, the present embodiment is described with reference to differences from the previous embodiment.

The surface treatment pattern layer 540 may be formed on the encapsulation member 530 to correspond to a non-display area 520b of the display device 520.

The surface treatment pattern layer 540 may be formed to have hydrophilicity or hydrophobicity. A material and method of forming the surface treatment pattern layer 540 may be the same as described with reference to the previous embodiment, thus, detailed descriptions thereof are not repeated here.

The photo-functional layer 550 may be formed on the encapsulation member 530 so as to correspond to the display area 520a. In an implementation, the photo-functional layer 550 may be spaced apart from the surface treatment pattern layer 540, or in another implementation, the photo-functional layer 560 may be formed to contact a side surface of the surface treatment pattern layer 540.

The photo-functional layer 550 may control a characteristic of light that is emitted from the display device 520. For example, the photo-functional layer 550 may be a photo-conversion member or a color filter that converts a color of light that is emitted from the display area 520a. The photo-functional layer 550 may improve a luminescent quality of the display apparatus 500 by changing or enhancing a characteristic of light that is emitted from the display area 520a.

In an implementation, the photo-functional layer 550 may include a material having a same or similar color as light emitted from the display area 520a.

For example, the photo-functional layer 550 may include blue, green, and red photo-functional layers 550.

The photo-functional layer 550 may have a different surface characteristic, i.e., hydrophilicity or hydrophobicity, from that of the surface treatment pattern layer 540. For example, if the surface treatment pattern layer 540 has hydrophilicity, the photo-functional layer 550 may have hydrophobicity, and if the surface treatment pattern layer 540 has hydrophobicity, the photo-functional layer 550 may have hydrophilicity.

By providing the photo-functional layer 550 with a different surface characteristic, i.e., hydrophilicity or hydrophobicity, from that of the surface treatment pattern layer 540, the photo-functional layer 550 may have a pattern that does not overlap the surface treatment pattern layer 540, and that corresponds to spaces between the surface treatment pattern layer 540 without performing a separate patterning process such as a photo-lithography process. The photo-functional layer 550 may be formed to be adjacent to the side surface of the surface treatment pattern layer 540 or may be formed in a space between portions of the surface treatment pattern layer 540.

In the present embodiment, the description that the photo-functional layer 550 "corresponds to" the surface treatment pattern layer 540 includes a meaning that the photo-functional layer 550 is formed to be spaced apart from or to contact the side surface of the surface treatment pattern layer 540 along a pattern of the surface treatment pattern layer 540.

A method of forming the photo-functional layer 550, in particular, a method of making the photo-functional layer 550 have hydrophobicity or hydrophilicity, may be the same as described with reference to the previous embodiment, thus, detailed descriptions thereof are not repeated here.

Figure 6:
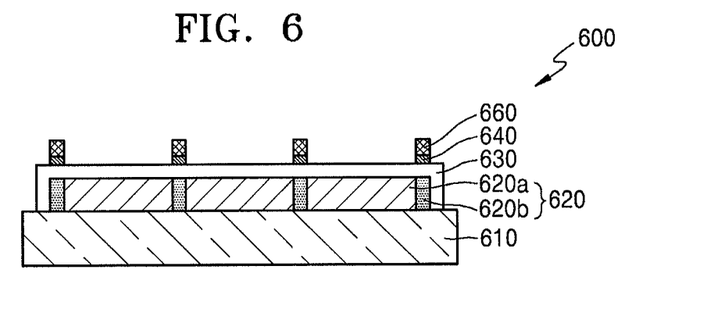
FIG. 6 illustrates a cross-sectional view of a display apparatus, according to another exemplary embodiment.

FIG. 6 illustrates a cross-sectional view of a display apparatus 600, according to another exemplary embodiment. For convenience of description, the present embodiment is described with reference to differences from the previous embodiment.

Referring to FIG. 6, the display apparatus 600 may include a substrate 610, a display device 620, an encapsulation member 630, a surface treatment pattern layer 640, and a photo-functional layer 660.

The surface treatment pattern layer 640 may be formed on the encapsulation member 630 so as to correspond to a non-display area 620b of the display device 620.

The photo-functional layer 660 may be formed so as to correspond to the surface treatment pattern layer 640. In an implementation, the photo-functional layer 660 may overlap with the surface treatment pattern layer 640.

The surface treatment pattern layer 640 may be formed to have hydrophilicity or hydrophobicity. A material and method of forming the surface treatment pattern layer 640 are the same as those described with reference to the previous embodiment, thus, detailed descriptions thereof are not repeated here.

The photo-functional layer 660 may be formed to correspond to the non-display area 620b. The photo-functional layer 660 may be capable of controlling a characteristic of light that is emitted from the display device 620. For example, the photo-functional layer 660 may include a member, e.g., a black matrix that blocks light so as to prevent the light, which is generated in the display area 620a, from being extracted via the non-display area 620b. By forming the photo-functional layer 660 as a black matrix, a contrast of the display apparatus 600 may be enhanced, such that a luminescent quality of the display apparatus 600 may be improved.

The photo-functional layer 660 may have hydrophilicity or hydrophobicity that is a same surface characteristic as that of the surface treatment pattern layer 640. For example, if the surface treatment pattern layer 640 has hydrophilicity, the photo-functional layer 660 may also have hydrophilicity, and if the surface treatment pattern layer 640 has hydrophobicity, the photo-functional layer 660 may also have hydrophobicity.

By providing the photo-functional layer 660 with the same surface characteristic as that of the surface treatment pattern layer 640, the photo-functional layer 660 may have a pattern that corresponds to the surface treatment pattern layer 640, without performing a separate patterning process such as a photo-lithography process. In the present embodiment, the description that the photo-functional layer 660 "corresponds to" the surface treatment pattern layer 640 includes a meaning that the photo-functional layer 660 overlaps with the surface treatment pattern layer 640 in the non-display area 120b.

Figure 7:
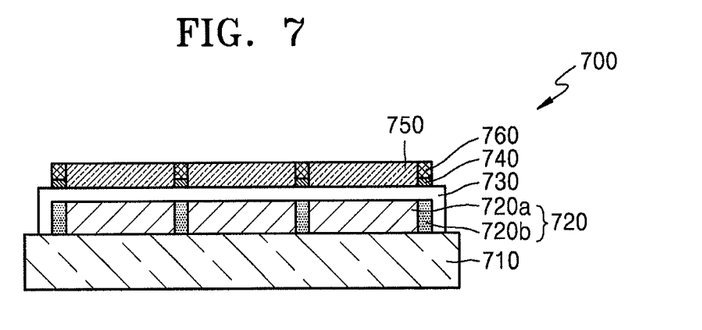
FIG. 7 illustrates a cross-sectional view of a display apparatus, according to another exemplary embodiment.

FIG. 7 illustrates a cross-sectional view of a display apparatus 700, according to another exemplary embodiment. For convenience of description, the present embodiment is described with reference to differences from the previous embodiment. Referring to FIG. 7, the display apparatus 700 may include a substrate 710, a display device 720, an encapsulation member 730, a surface treatment pattern layer 740, a first photo-functional layer 750, and a second photo-functional layer 760.

The surface treatment pattern layer 740, the first photo-functional layer 750, and the second photo-functional layer 760 may be formed on the encapsulation member 730.

The surface treatment pattern layer 740 may be formed on the encapsulation member 730 so as to correspond to a non-display area 720b of the display device 720.

The surface treatment pattern layer 740 may be formed to have hydrophilicity or hydrophobicity. A material and method of forming the surface treatment pattern layer 740 may be the same as described with reference to the previous embodiment, thus, detailed descriptions thereof are not repeated here.

The first photo-functional layer 750 may control a characteristic of light that is emitted from the display device 720. For example, the first photo-functional layer 750 may be a photoconversion member or a color filter that converts a color of light that is emitted from the display area 720a. The first photo-functional layer 750 may improve a luminescent quality of the display apparatus 700 by changing or enhancing a characteristic of light that is emitted from the display area 720a.

The first photo-functional layer 750 may have a different surface characteristic, i.e., hydrophilicity or hydrophobicity, from that of the surface treatment pattern layer 740. For example, if the surface treatment pattern layer 740 has hydrophilicity, the first photo-functional layer 750 may have hydrophobicity, and if the surface treatment pattern layer 740 has hydrophobicity, the first photo-functional layer 750 may have hydrophilicity.

The first photo-functional layer 750 may be formed so as to correspond to the surface treatment pattern layer 740. For example, the first photo-functional layer 750 may be spaced apart from the surface treatment pattern layer 740, or in another implementation, the first photo-functional layer 750 may be formed to contact a side surface of the surface treatment pattern layer 740.

The second photo-functional layer 760 may be formed to correspond to the non-display area 720b. The second photo-functional layer 760 may control a characteristic of light that is emitted from the display device 720. For example, the second photo-functional layer 760 may include a member, e.g., a black matrix that blocks light so as to prevent light that is generated in the display area 720a, from being extracted via the non-display area 720b. By forming the second photo-functional layer 760 as a black matrix, a contrast of the display apparatus 700 may be enhanced, such that a luminescent quality of the display apparatus 700 may be improved.

The second photo-functional layer 760 may have a same surface characteristic, i.e., hydrophilicity or hydrophobicity, as that of the surface treatment pattern layer 740. For example, if the surface treatment pattern layer 740 has hydrophilicity, the second photo-functional layer 760 may have hydrophilicity, and if the surface treatment pattern layer 740 has hydrophobicity, the second photo-functional layer 760 may have hydrophobicity.

The second photo-functional layer 760 may be formed on the surface treatment pattern layer 740 such that the second photo-functional layer 760 overlaps with the surface treatment pattern layer 740. The description that the second photo-functional layer 760 "corresponds to" the surface treatment pattern layer 740 includes a meaning that the second photo-functional layer 760 overlaps with the surface treatment pattern layer 740 in the non-display area 720b.

In an implementation, a side surface of the first photo-functional layer 750 may contact the second photo-functional layer 760.

In another implementation, a side surface of the second photo-functional layer 760 may contact the first photo-functional layer 750.

In another implementation, a side surface of the first photo-functional layer 750 may contact a side surface of the second photo-functional layer 760.

Figure 8:
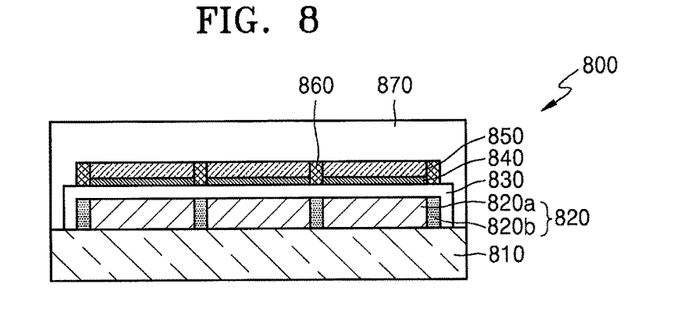
FIG. 8 illustrates a cross-sectional view of a display apparatus, according to another exemplary embodiment.

FIG. 8 illustrates a cross-sectional view of a display apparatus 800, according to another exemplary embodiment.

For convenience of description, the present embodiment is described with reference to differences from the previous embodiment.

Referring to FIG. 8, the display apparatus 800 may include a substrate 810, a display device 820, an encapsulation member 830, a surface treatment pattern layer 840, a first photo-functional layer 850, a second photo-functional layer 860, and a protective layer 870.

For example, compared to the display apparatus 400 of FIG. 4, the display apparatus 800 of FIG. 8 may further include the protective layer 870.

The protective layer 870 may be formed on the first photo-functional layer 850 and the second photo-functional layer 860. In an implementation, the protective layer 870 may be formed to cover the first photo-functional layer 850 and the second photo-functional layer 860.

The protective layer 870 of the present embodiment may be applied to the embodiments of FIGS. 1, 3, 5 and 6 and embodiments of FIGS. 9 and 10 described below.

Figure 9:
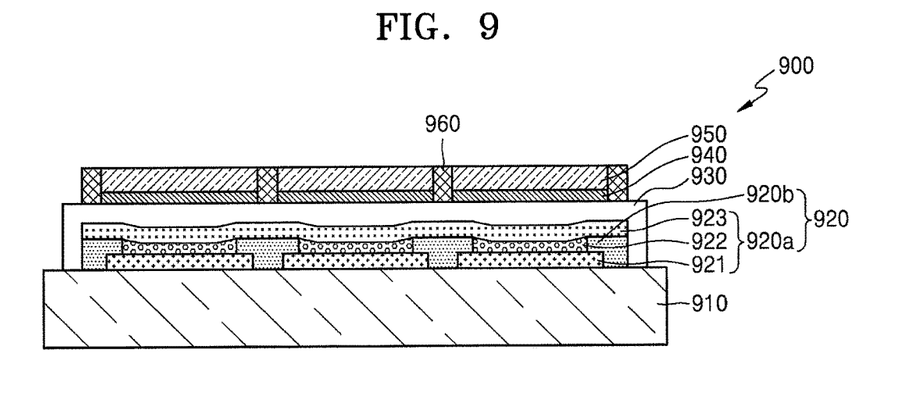
FIG. 9 illustrates a cross-sectional view of a display apparatus, according to another exemplary embodiment.

FIG. 9 illustrates a cross-sectional view of a display apparatus 900, according to another exemplary embodiment.

Referring to FIG. 9, the display apparatus 900 may include a substrate 910, a display device 920, an encapsulation member 930, a surface treatment pattern layer 940, a first photo-functional layer 950, and a second photo-functional layer 960. For convenience of description, the present embodiment is described with reference to differences from the previous embodiment.

The display device 920 may include a display area 920a and a non-display area 920b on the substrate 910.

A first electrode 921, an intermediate layer 922 including an emission layer, and a second electrode 923 may be formed in the display area 920a. The encapsulation member 930 may be disposed on the second electrode 923.

In an implementation, the display area 920a may include a portion in which the first electrode 921, the intermediate layer 922, and the second electrode 923 overlap with each other. The non-display area 920b may include a portion in which all of the first electrode 921, the intermediate layer 922, and the second electrode 923 are absent. In another implementation, the non-display area 920b may include a portion in which at least one of the first electrode 921, the intermediate layer 922, and the second electrode 923 are absent.

The surface treatment pattern layer 940, the first photo-functional layer 950, and the second photo-functional layer 960 may be formed on the encapsulation member 930. Detailed descriptions of the surface treatment pattern layer 940, the first photo-functional layer 950, and the second photo-functional layer 960 are the same as those described with reference to FIG. 4, and thus are not repeated here.

The display device 920 of the present embodiment may be applied to the embodiments of FIGS. 1 through 8.

Figure 10:
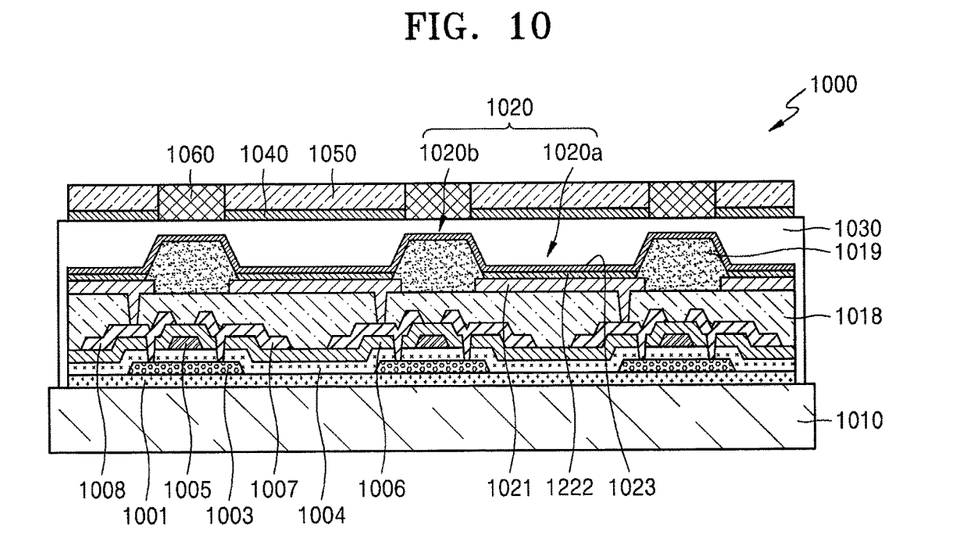
FIG. 10 illustrates a cross-sectional view of a display apparatus, according to another exemplary embodiment.

FIG. 10 illustrates a cross-sectional view of a display apparatus 1000, according to another exemplary embodiment.

Referring to FIG. 10, the display apparatus 1000 may include a substrate 1010, a display device 1020, an encapsulation member 1030, a surface treatment pattern layer 1040, a first photo-functional layer 1050, and a second photo-functional layer 1060. The display apparatus 1000 may further include a thin-film transistor that includes an active layer 1003, a gate electrode 1005, a source electrode 1007, and a drain electrode 1008.

A buffer layer 1001 may be formed on the substrate 1010. In some implementations, the buffer layer 1001 may be omitted.

The active layer 1003 with a predetermined pattern may be formed on the buffer layer 1001. The active layer 1003 may be formed of an inorganic semiconductor such as amorphous silicon or polysilicon. In an implementation, the active layer 1003 may be formed of an organic semiconductor. In another implementation, the active layer 1003 may include an oxide semiconductor material. In an implementation, the active layer 1003 may be doped with the group III or V impurities.

A gate insulating layer 1004 may be formed on the active layer 1003, and the gate electrode 1005 may be formed on a predetermined area of a top surface of the gate insulating layer 1004. The gate insulating layer 1004 may be arranged to insulate the active layer 1003 from the gate electrode 1005. the gate insulating layer 1004 may be formed of an organic material or an inorganic material such as $SiN_x$ or $SiO_2$.

The gate electrode 1005 may be formed by a suitable material in consideration of adhesion with respect to a neighboring layer, planarization, electrical resistance, formability, or the like. For example, the gate electrode 1005 may be formed of a metal selected from the group of Au, Ag, Cu, Ni, Pt, Pd, Al, and Mo, or may be formed of a metal alloy such as Al—Nd alloy, Mo—W alloy, or the like, as examples An interlayer insulating layer 1006 may be formed on the gate electrode 1005. The interlayer insulating layer 1006 and the gate insulating layer 1004 may be formed to expose predetermined areas of the active layer 1003. The source electrode 1007 and the drain electrode 1008 may be formed to contact the exposed areas of the active layer 1003.

The source electrode 1007 and the drain electrode 1008 may be formed by using a suitable conductive material. The source electrode 1007 and the drain electrode 1008 may have a single-layered structure or a multi-layered structure.

A passivation layer 1018 may be formed on the source electrode 1007 and the drain electrode 1008. The passivation layer 1018 may be formed to expose predetermined areas of the drain electrode 1008, and a first electrode 1021 may be formed to be connected to the exposed areas of the drain electrode 1008.

A pixel-defining layer 1019 may be formed on the first electrode 1021 by using an insulating material. The pixel-defining layer 1019 may be formed to expose a predetermined area of the first electrode 1021. An intermediate layer 1022 including an emission layer may be formed to contact the exposed first electrode 1021. A second electrode 1023 may be formed on the intermediate layer 1022.

The encapsulation member 1030 may be disposed on the second electrode 1023.

The display device 1020 may include a display area 1020a and a non-display area 1020b. In an implementation, the display area 1020a may include a portion in which the first electrode 1021, the intermediate layer 1022, and the second electrode 1023 overlap with each other. The non-display area 1020b may include a portion in which all of the first electrode 1021, the intermediate layer 1022, and the second electrode 1023 are not present. In another implementation, the non-display area 1020b may include a portion in which at least one of the first electrode 1021, the intermediate layer 1022, and the second electrode 1023 are not present.

The surface treatment pattern layer 1040, the first photo-functional layer 1050, and the second photo-functional layer 1060 may be formed on the encapsulation member 1030. Detailed descriptions of the surface treatment pattern layer 1040, the first photo-functional layer 1050, and the second photo-functional layer 1060 are the same as those described with reference to FIG. 4, and thus are not repeated here.

The display apparatus 1000 of the present embodiment, i.e., a structure below the surface treatment pattern layer 1040, may be selectively applied to the embodiments of FIGS. 1 through 8.

By way of summation and review, a characteristic of a display apparatus may deteriorate due to exterior moisture or oxygen. For example, an electrical characteristic of a display device that is arranged in the display apparatus and provides an image may deteriorate.

Thus, it is desirable to improve an image characteristic of the display apparatus, i.e., brightness or a contrast of the display apparatus.

Embodiments provide display apparatus that has an improved luminescent quality and a method of manufacturing such a display apparatus.

Embodiments provide a display apparatus and a method of manufacturing the display apparatus, whereby image characteristics and manufacturing convenience of the display apparatus may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
   a substrate;
   a display device on the substrate, the display device including a display area and a non-display area;
   an encapsulation member covering the display device;
   a surface treatment pattern layer on the encapsulation member, the surface treatment pattern layer selectively corresponding to one of the display area and the non-display area and having hydrophilicity or hydrophobicity; and
   a photo-functional layer corresponding to a pattern of the surface treatment pattern layer, wherein the surface treatment pattern layer and the photo-functional layer satisfy one of the following conditions (a) to (d):
   (a) the surface treatment layer corresponds to the display area, the photo-functional layer includes a color filter, and the color filter has a same hydrophobic or hydrophilic surface characteristic as the surface treatment pattern layer and includes an area overlapping the surface treatment pattern layer;
   (b) the surface treatment pattern layer corresponds to the display area, the photo-functional layer includes a black matrix that overlaps the non-display area, the black matrix having a different hydrophobic or hydrophilic surface characteristic from the surface treatment pattern layer and contacting sides of the surface treatment pattern layer;
   (c) the surface treatment pattern layer corresponds to the non-display area, the photo-functional layer includes a black matrix that overlaps the non-display area, the black matrix having same hydrophobic or hydrophilic surface characteristic as the surface treatment pattern layer and including an area overlapping the surface treatment pattern layer; or
   (d) the surface treatment pattern layer corresponds to the non-display area, the photo-functional layer includes a color filter, the color filter having a different hydrophobic or hydrophilic surface characteristic from the surface treatment pattern layer and being spaced apart from or adjacent to the surface treatment pattern layer.

2. The display apparatus as claimed in claim 1, wherein the surface treatment pattern layer includes at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS).

3. The display apparatus as claimed in claim 1, wherein:
   the surface treatment pattern layer corresponds to the display area,
   the photo-functional layer includes the color filter, and
   the color filter has a same hydrophobic or hydrophilic surface characteristic as the surface treatment pattern layer and includes an area overlapping the surface treatment pattern layer.

4. The display apparatus as claimed in claim 1, wherein:
   the surface treatment pattern layer corresponds to the display area,
   the photo-functional layer includes the black matrix, and
   the black matrix has a different hydrophobic or hydrophilic surface characteristic from the surface treatment pattern layer and contacts sides of the surface treatment pattern layer.

5. The display apparatus as claimed in claim 1, wherein:
   the surface treatment pattern layer corresponds to the non-display area,
   the photo-functional layer includes the black matrix, and
   the black matrix has same hydrophobic or hydrophilic surface characteristic as the surface treatment pattern layer and includes an area overlapping the surface treatment pattern layer.

6. The display apparatus as claimed in claim 1, wherein:
   the surface treatment pattern layer corresponds to the non-display area,
   the photo-functional layer includes the color filter, and
   the color filter has a different hydrophobic or hydrophilic surface characteristic from the surface treatment pattern layer and is spaced apart from the surface treatment pattern layer or is adjacent to the surface treatment pattern layer.

7. The display apparatus as claimed in claim 1, further comprising a protective layer that covers the photo-functional layer.

8. The display apparatus as claimed in claim 1, wherein the display device includes a first electrode, an intermediate layer comprising an emission layer, and a second electrode.

9. The display apparatus as claimed in claim 1, wherein the encapsulation member includes at least one organic film or inorganic film.

10. The display apparatus as claimed in claim 9, wherein:
    an outermost layer of the encapsulation member includes the inorganic film, and
    the surface treatment pattern layer contacts the inorganic film of the outermost layer of the encapsulation member.

11. A method of manufacturing a display apparatus, the method comprising:
    forming a display device including a display area and a non-display area on a substrate;
    forming an encapsulation member that covers the display device;
    forming a surface treatment pattern layer having hydrophilicity or hydrophobicity by selectively performing a surface treatment such that the surface treatment pattern layer has a pattern corresponding to the display area or the non-display area; and
    forming a photo-functional layer so as to correspond to a pattern of the surface treatment pattern layer, wherein forming the surface treatment pattern layer and the photo-functional layer satisfies one of the following conditions (e) to (h):
    (e) the surface treatment layer is formed to correspond to the display area, and the photo-functional layer is formed to include a color filter having a same hydrophobic or hydrophilic surface characteristic as the surface treatment pattern layer and including an area overlapping the surface treatment pattern layer;

(f) the surface treatment pattern layer is formed to correspond to the display area, and the photo-functional layer is formed to include a black matrix that overlaps the non-display area, the black matrix having a different hydrophobic or hydrophilic surface characteristic from the surface treatment pattern layer and contacting sides of the surface treatment pattern layer;

(g) the surface treatment pattern layer is formed to correspond to the non-display area, and the photo-functional layer is formed a black matrix that overlaps the non-display area, the black matrix having same hydrophobic or hydrophilic surface characteristic as the surface treatment pattern layer and including an area overlapping the surface treatment pattern layer; or (h) the surface treatment pattern layer is formed to correspond to the non-display area, and the photo-functional layer is formed to include a color filter having a different hydrophobic or hydrophilic surface characteristic from the surface treatment pattern layer and being spaced apart from or adjacent to the surface treatment pattern layer.

12. The method as claimed in claim 11, wherein forming the surface treatment pattern layer includes controlling a surface energy to be selectively different in the display area and the non-display area.

13. The method as claimed in claim 11, wherein forming the surface treatment pattern layer includes performing a process of irradiating energy such that the surface treatment pattern layer selectively has hydrophilicity or hydrophobicity.

14. The method as claimed in claim 11, wherein forming the surface treatment pattern layer is performed by using at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS).

15. A method of manufacturing a display apparatus, the method comprising:
 forming a display device including a display area and a non-display area on a substrate;
 forming an encapsulation member that covers the display device;
 forming a surface treatment pattern layer having hydrophilicity or hydrophobicity by selectively performing a surface treatment such that the surface treatment pattern layer has a pattern corresponding to the display area or the non-display area; and
 forming a photo-functional layer so as to correspond to a pattern of the surface treatment pattern layer, wherein:
 forming the surface treatment pattern layer is performed by using at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS), and
 forming the surface treatment pattern layer includes adjusting an amount of a component in at least one selected from tetramethylsilane (TMS), tetraethoxysilane (TEOS), hexamethyldisiloxane (HMDSO), tetramethyldisiloxane (TMDSO), hexamethyldisilazane (HMDSN), tetramethylcyclotetrasiloxane (TOMCTS), and octamethylcyclotetrasiloxane (OMCTS) such that the surface treatment pattern layer selectively has hydrophilicity or hydrophobicity.

16. The method as claimed in claim 11, wherein forming the surface treatment pattern layer is performed by using a same process as a process used in the forming of the encapsulation member.

17. The method as claimed in claim 16, wherein:
 forming the encapsulation member includes forming the encapsulation member to include an inorganic film as an outermost layer of the encapsulation member, and
 forming of surface treatment pattern layer is performed by using a same process as a process of forming the inorganic film as the outermost layer of the encapsulation member.

18. The method as claimed in claim 17, wherein:
 the inorganic film as the outermost layer of the encapsulation member is formed by using a chemical vapor deposition (CVD) process, and
 forming the surface treatment pattern layer is performed by using the CVD process.

* * * * *